United States Patent
Jang et al.

(10) Patent No.: US 10,165,712 B1
(45) Date of Patent: Dec. 25, 2018

(54) OUTDOOR DISPLAY APPARATUS HAVING ENHANCED TEMPERATURE STABILITY

(71) Applicant: HYUNDAI IT CO., LTD., Seoul (KR)

(72) Inventors: Sang Hun Jang, Gimcheon-si (KR); Seung Wun Seo, Gumi-si (KR)

(73) Assignee: HYUNDAI IT CO., LTD., Seoul (KR)

( * ) Notice: Subject to any disclaimer, the term of this patent is extended or adjusted under 35 U.S.C. 154(b) by 0 days.

(21) Appl. No.: 15/824,186

(22) Filed: Nov. 28, 2017

(30) Foreign Application Priority Data

Nov. 22, 2017 (KR) .......................... 10-2017-0156114

(51) Int. Cl.
| | |
|---|---|
| *H05K 5/00* | (2006.01) |
| *H05K 7/20* | (2006.01) |
| *H05K 7/14* | (2006.01) |
| *G09F 15/00* | (2006.01) |
| *H05K 5/03* | (2006.01) |
| *G09F 9/00* | (2006.01) |

(52) U.S. Cl.
CPC ..... *H05K 7/20972* (2013.01); *G09F 15/0006* (2013.01); *H05K 5/0017* (2013.01); *H05K 5/03* (2013.01); *H05K 7/1417* (2013.01); *G09F 9/00* (2013.01)

(58) Field of Classification Search
CPC ........... H05K 7/20972; H05K 7/20954; H05K 5/0017; H05K 5/03; H05K 7/1417; G09F 15/0006; G09F 9/00
USPC ..... 361/692, 695, 679.01, 690, 694, 679.21, 361/679.48, 679.49, 715; 362/373, 218; 454/184, 252; 165/80.2; 348/748
See application file for complete search history.

(56) References Cited

U.S. PATENT DOCUMENTS

| | | | |
|---|---|---|---|
| 9,894,800 B2 * | 2/2018 | Dunn | ................ G02F 1/133385 |
| 2011/0037937 A1 | 2/2011 | Yang et al. | |
| 2011/0085302 A1 | 4/2011 | Nakamichi et al. | |
| 2014/0334100 A1 | 11/2014 | Yoon et al. | |

FOREIGN PATENT DOCUMENTS

KR        10-1153351 B1        6/2012

OTHER PUBLICATIONS

The extended European search report dated Jul. 23, 2018 in connection with the counterpart European Patent Application No. 17203976.0, citing the above reference(s).

* cited by examiner

*Primary Examiner* — Mandeep S Buttar
(74) *Attorney, Agent, or Firm* — Hauptman Ham, LLP

(57) ABSTRACT

An outdoor display apparatus having enhanced temperature stability comprises: a display panel having a driver board; a rear bracket coupled to the display panel; and a housing for accommodating a rear bracket coupled to the display panel, being coupled to a transparent optical member disposed on a front surface of the display panel and having at least one inlet and at least one outlet, wherein: the inlet is formed at a lower portion of a rear surface of the housing, the outlet is formed at an upper portion of a rear surface of the housing, and air flows through a first clearance space existing between the rear bracket and the housing, a second clearance space existing between the rear bracket and the rear surface of the display panel and a third clearance space existing between the front surface of the display panel and the transparent optical member.

18 Claims, 20 Drawing Sheets

OUTDOOR DISPLAY APPARATUS HAVING ENHANCED TEMPERATURE STABILITY

CROSS-REFERENCE TO RELATED APPLICATIONS

This application claims the benefit of Korean Patent Application No. 10-2017-0156114 filed with the Korean Intellectual Property Office on Nov. 11, 2017, the disclosures of which are incorporated herein by reference.

TECHNICAL FIELD

The present invention relates to an outdoor display apparatus having enhanced temperature stability. In the process of controlling the temperature inside the outdoor display apparatus of the present invention, the air circulates the main heat-generating parts inside the apparatus uniformly, so that the overall temperature distribution inside the apparatus can be kept constant, the time required for calibrating temperature inside the apparatus to a target value can be shortened, the operation time of the fan that induces the airflow can be reduced while allowing the temperature inside the apparatus to accurately reach the target value.

BACKGROUND

Generally, in the outdoor display apparatus which can be used for an outdoor advertising apparatus, the heat generated inside the apparatus and direct sunlight raise the temperature inside the apparatus and in the front panel of the display to cause malfunction and shorten the lifetime of the apparatus.

In order to solve such a problem, one of the conventional technologies in Korean Patent No. 10-1153351, which was registered on May 30, 2012, has adopted a method of forcibly cooling the heat by installing an air conditioner including a compressor at the lower part or the rear part of the display apparatus to cool the heat generated inside.

However, there is a problem in that a production cost increases due to an additional component such as an air conditioner to be provided inside the product, and the overall size of the product increases compared to the actual display portion.

(Prior Art 0001) Korean Patent No. 10-1153351 (May 30, 2012)

SUMMARY

The present invention has been made in view of the above problems, and it is an object of the present invention to provide an apparatus and a method for controlling the temperature inside the display apparatus by evenly circulating the airflows through the main heat-generating parts inside the apparatus so that it can shorten the time required for calibration and reduce the operation time of the fan for inducing the air flow while allowing the temperature inside the apparatus to accurately reach the target value.

It is another object of the present invention to provide an outdoor display apparatus with enhanced temperature stability in order to prevent a malfunction and a shortening of life of the display apparatus by suppressing a rise in the temperature at both the front panel and the inside of the display panel due to self-generated interior heat and exterior heat caused by direct sunlight, reduce the difference between the external temperature and the inside temperature of the display apparatus to uniformly maintain the temperature inside the display apparatus.

It is another object of the present invention to enhance the temperature stability of an outdoor display apparatus by discharging heat inside the apparatus through an improved air flow path without providing an expensive and large-sized air conditioner inside the outdoor display apparatus, lowers the unit price of the display apparatus and provides a relatively compact product.

Technical Solution

According to some embodiment of the present invention, an outdoor display apparatus having enhanced temperature stability comprises a display panel having a driver board; a rear bracket coupled to the display panel having the driver board; and a housing for accommodating a rear bracket coupled to the display panel, being coupled to a transparent optical member disposed on a front surface of the display panel and having at least one inlet through which external air is air is introduced and at least one outlet through which internal air is discharged, wherein: the inlet is formed at a lower portion of a rear surface of the housing, the outlet is formed at an upper portion of a rear surface of the housing, and air flows through a first clearance space existing between the rear bracket and the housing, a second clearance space existing between the rear bracket and the rear surface of the display panel and a third clearance space existing between the front surface of the display panel and the transparent optical member.

According to some embodiments of the present invention, an outdoor display apparatus having enhanced temperature stability comprises a display panel having a driver board; a rear bracket coupled to the display panel having the driver board; and a housing for accommodating a rear bracket coupled to the display panel, being coupled to a transparent optical member disposed on a front surface of the display panel and having at least one inlet through which external air is introduced and at least one outlet through which internal air is discharged, wherein: the inlet is formed at a lower bottom portion of the housing, the outlet is formed at an upper side portion of the housing, and air flows through a first clearance space existing between the rear bracket and the housing, a second clearance space existing between the rear bracket and the rear surface of the display panel and a third clearance space existing between the front surface of the display panel and the transparent optical member.

Advantageous Effects

According to the present invention, there is provided an apparatus and a method for controlling the temperature inside the display apparatus by evenly circulating the airflows through the main heat-generating parts inside the apparatus so that it can shorten the time required for calibration and reduce the operation time of the fan for inducing the air flow while allowing the temperature inside the apparatus to accurately reach the target value.

In addition, there is provided an outdoor display apparatus with enhanced temperature stability that can prevent a malfunction and a shortening of life of the display apparatus by suppressing a rise in the temperature at both the front panel and the inside of the display panel due to self-generated interior heat and exterior heat caused by direct sunlight, reduce the difference between the external temperature the inside temperature of the display apparatus to uniformly maintain the temperature inside the display apparatus.

In addition, there is provided an outdoor display apparatus that can enhance the temperature stability by discharging heat inside the apparatus through an improved air flow path without providing an expensive and large-sized air conditioner inside the outdoor display apparatus, lowers the unit price of the display apparatus and provides a relatively compact product.

DESCRIPTION OF EMBODIMENTS

The specific structural or functional description of the embodiments of the present invention disclosed herein is merely illustrative for the purpose of illustrating embodiments of the present invention, and the present invention may be embodied in various forms and is not limited to the embodiments set forth herein. Additional advantages and modifications will readily occur to those skilled in the art. Therefore, the disclosure in its broader aspects is not limited to the specific details and representative embodiments shown and described herein. Accordingly, various modifications may be made without departing from the spirit or scope of the general inventive concept as defined by the appended claims and their equivalents.

Figure 1:
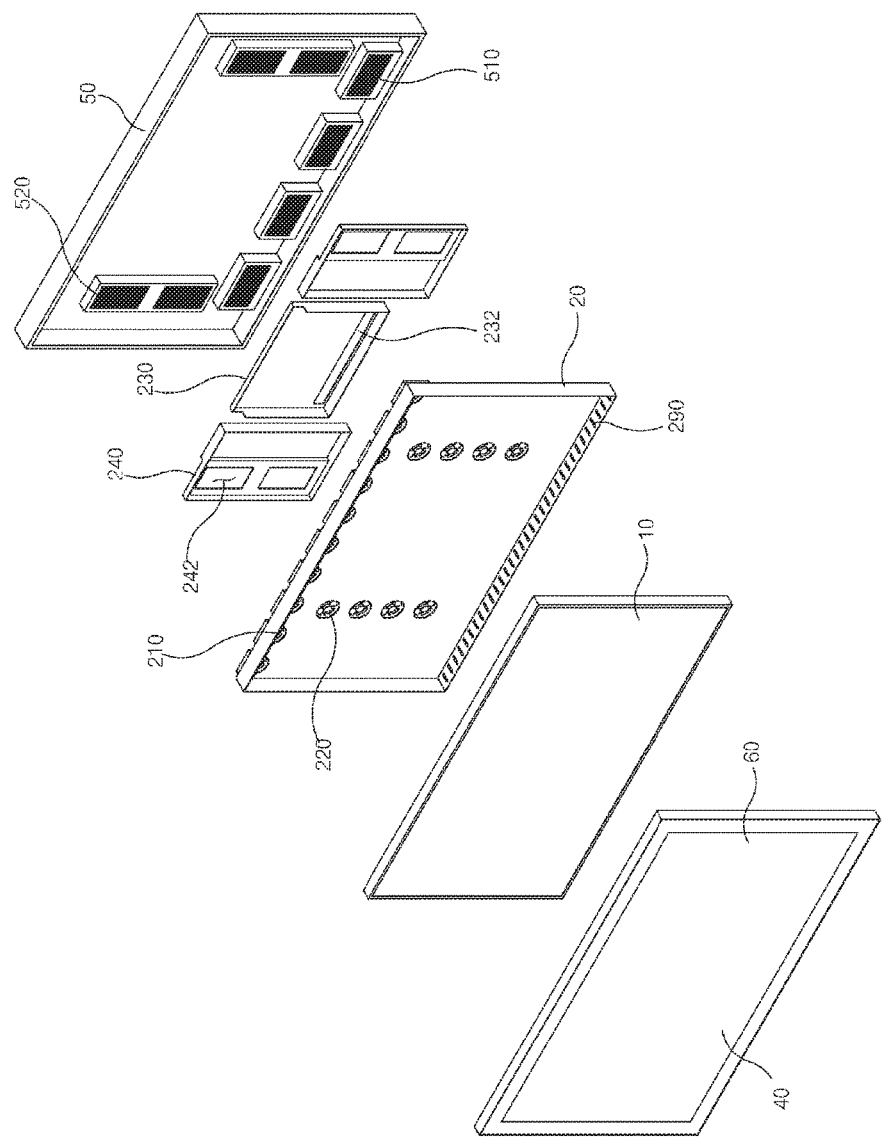
FIG. 1 is an exploded perspective view of an outdoor display apparatus with enhanced temperature stability according to a first embodiment of the present invention.
Figure 2:
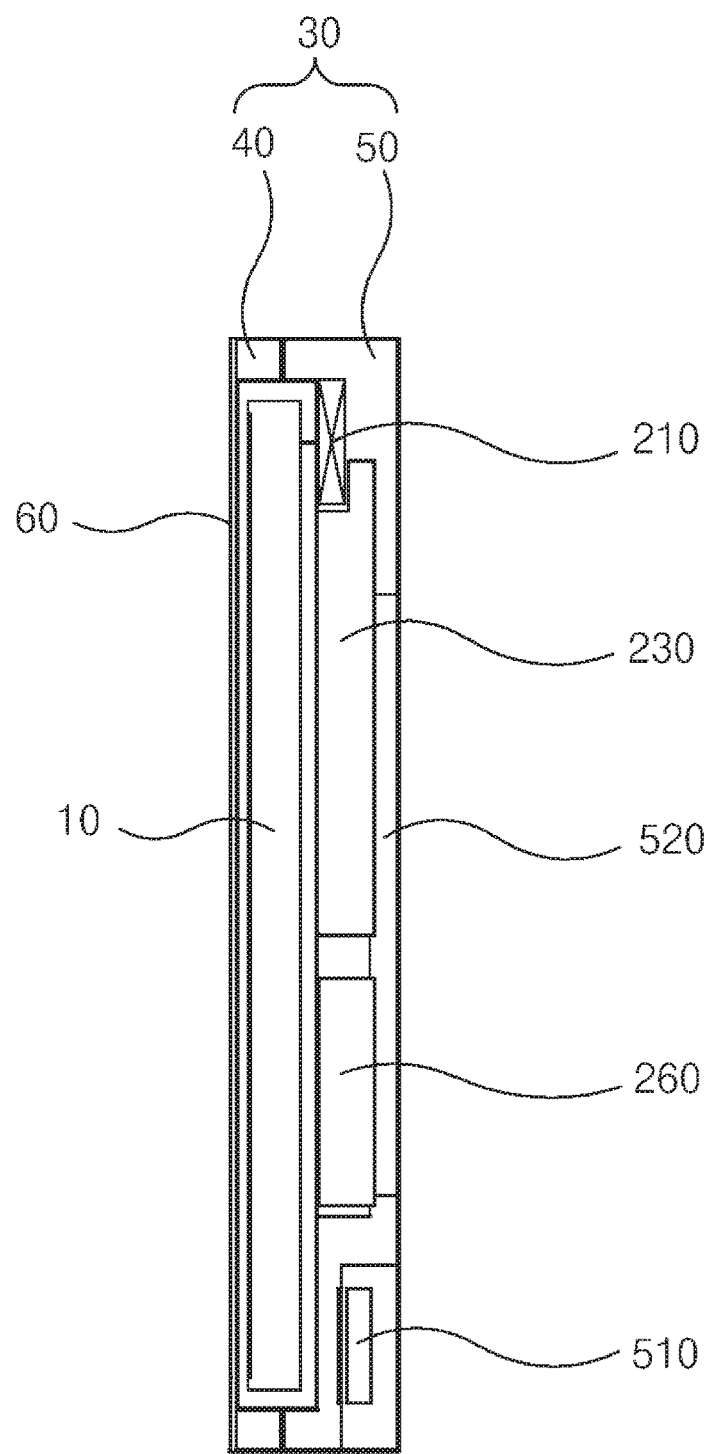
FIG. 2 is a cross-sectional view of an assembled outdoor display apparatus having enhanced temperature stability according to the first embodiment of the present invention.
Figure 5:
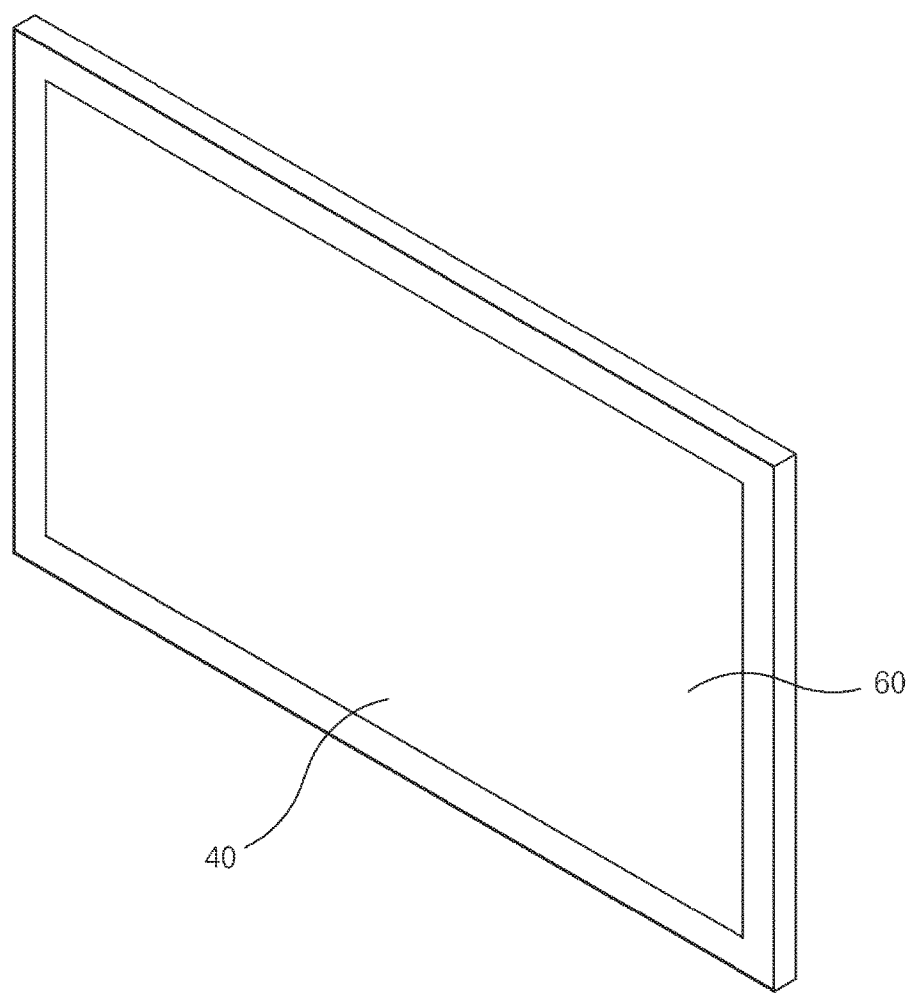
FIG. 5 is a view showing an exemplary shape of a front housing constituting an overall housing included in the first and second embodiments of the present invention.
Figure 6:
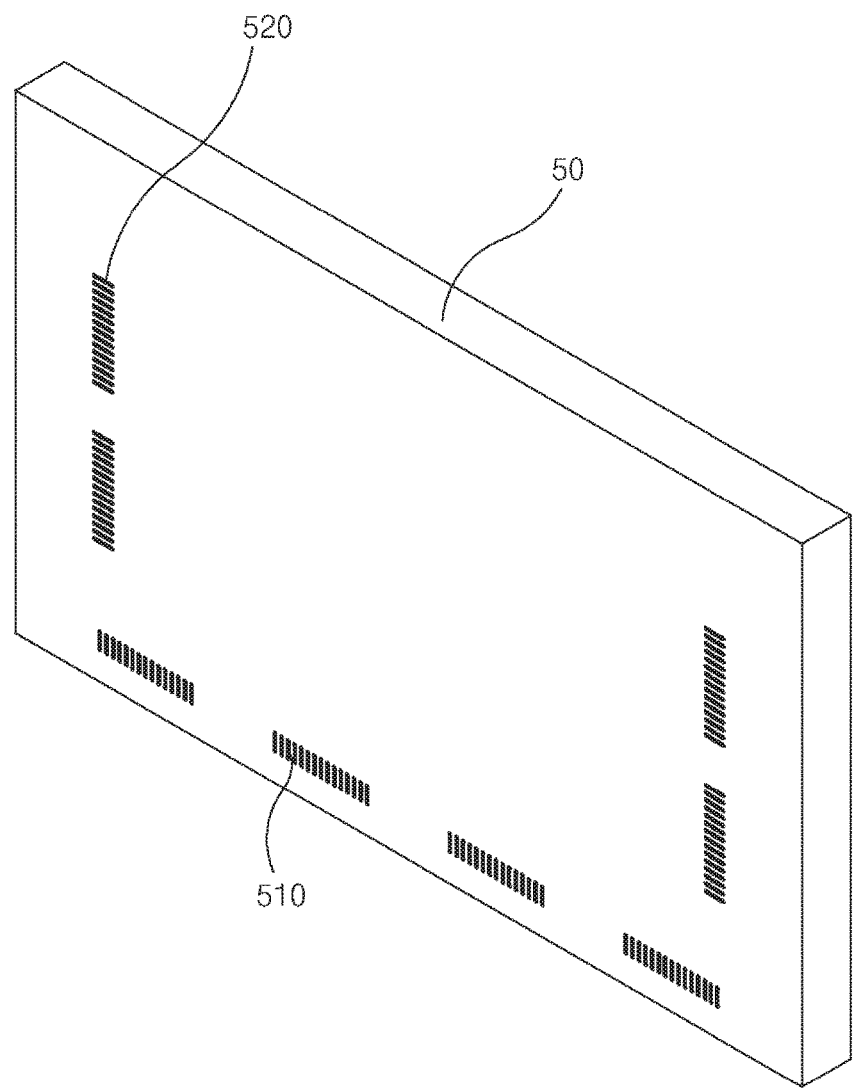
FIG. 6 is a view showing an exemplary rear view of the rear housing included in the first embodiment of the present invention.
Figure 7:
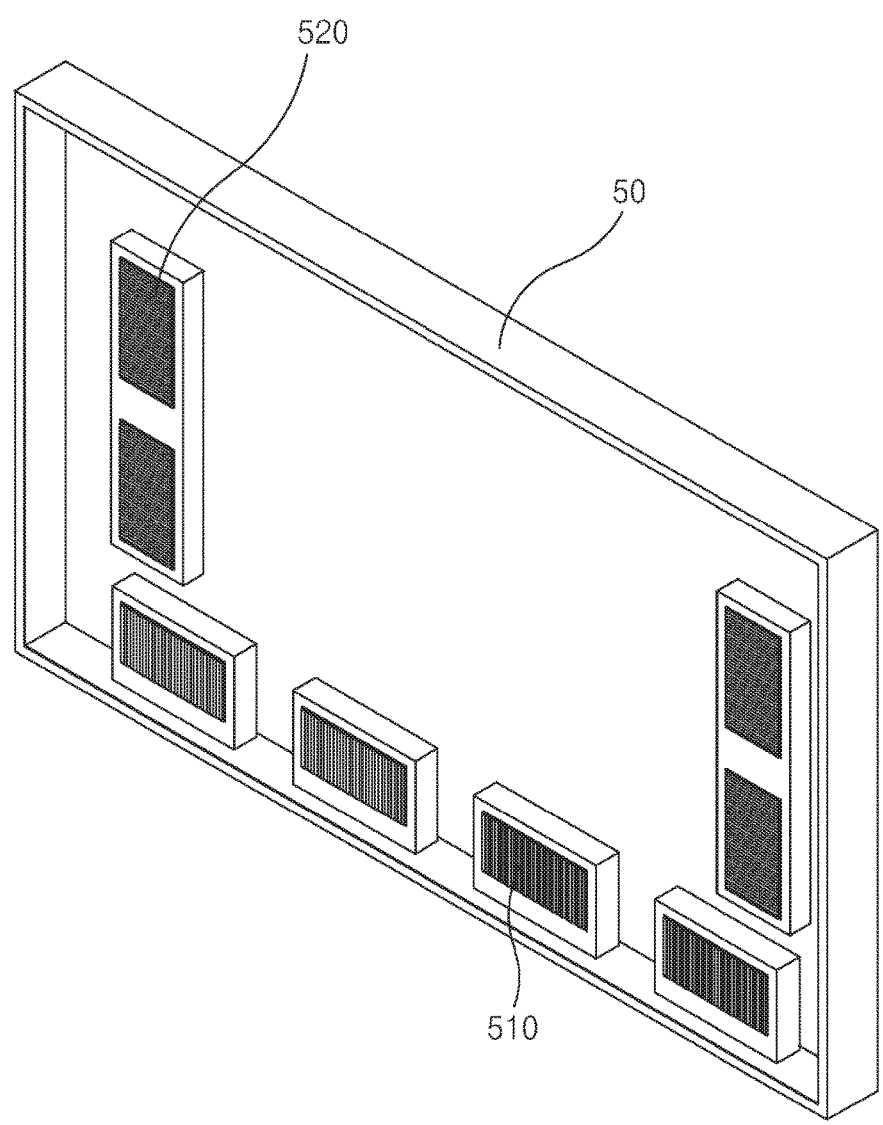
FIG. 7 is a view showing an exemplary front view of the rear housing included in the first embodiment of the present invention.
Figure 8:
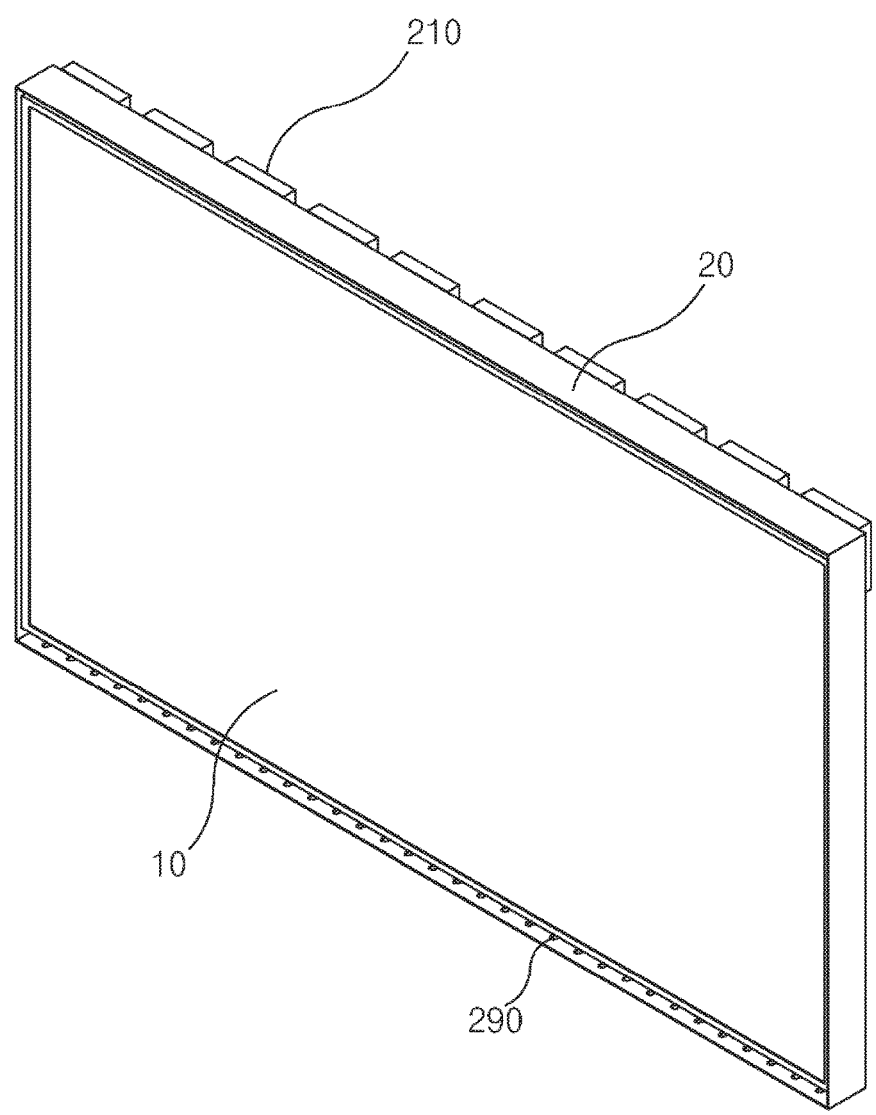
FIG. 8 is a view showing an exemplary front view of a combination of a display panel and a rear bracket included in the first and second embodiments of the present invention.
Figure 9:
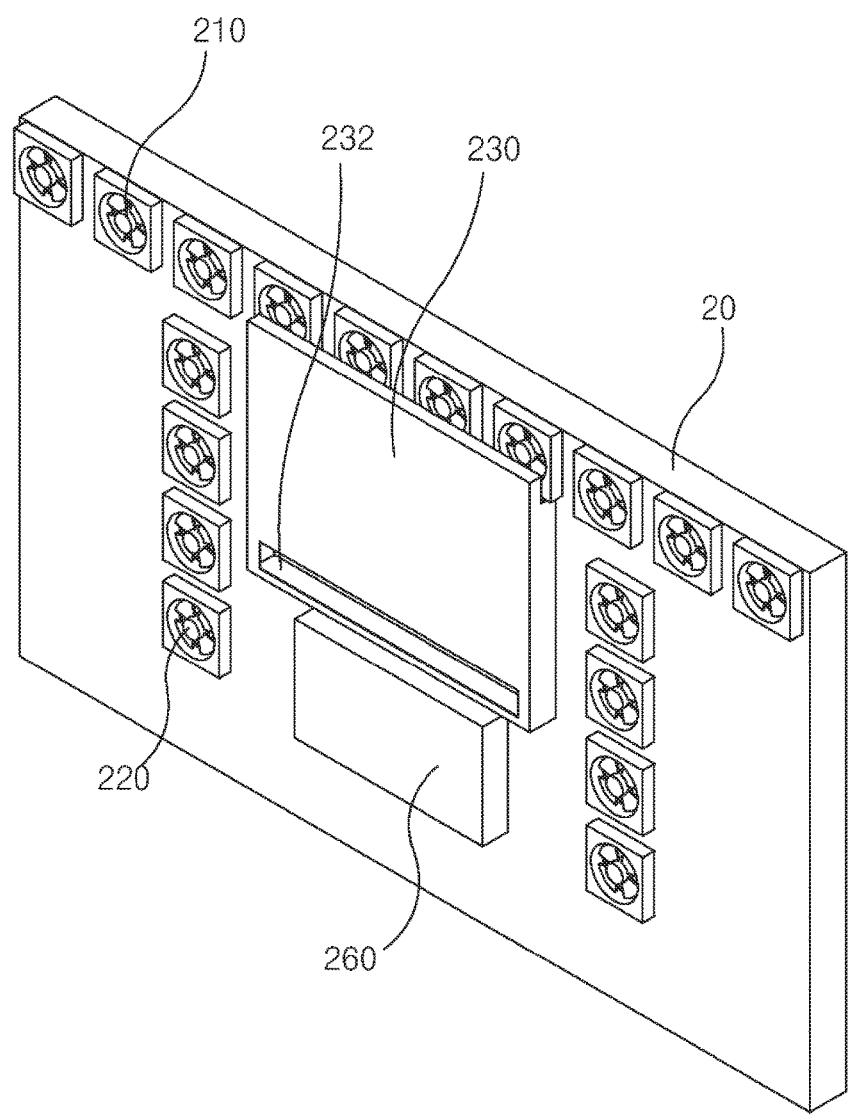
FIG. 9 is a view showing an exemplary rear view of a combination of a display panel and a rear bracket included in the first and second embodiments of the present invention.
Figure 10:
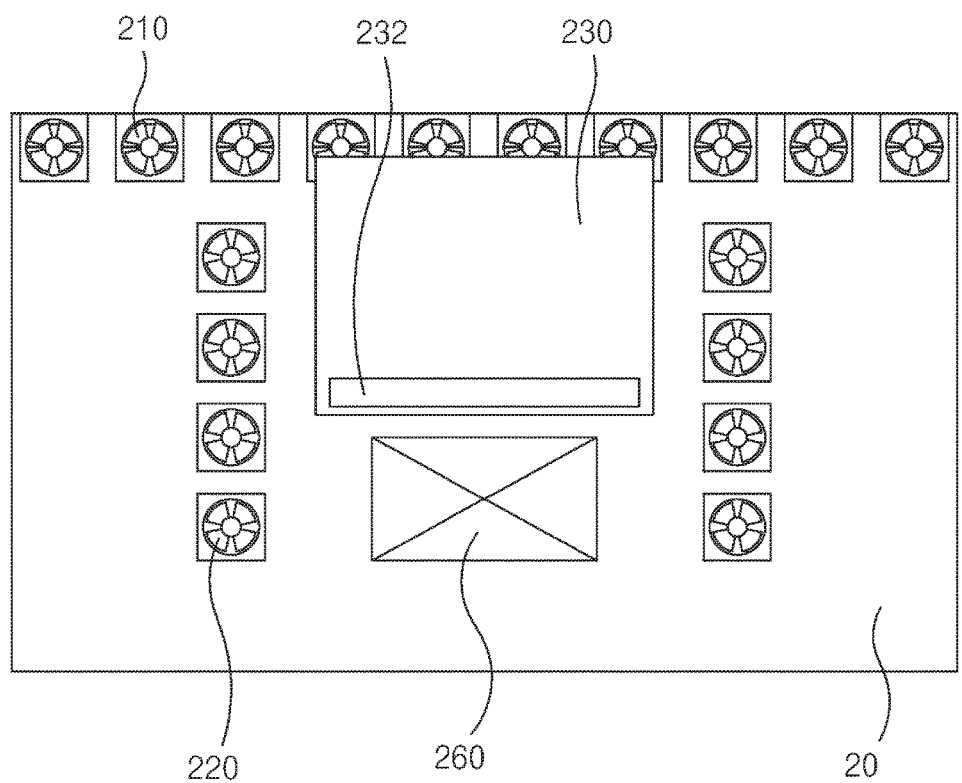
FIG. 10 is front view showing the combination of FIG. 9.
Figure 11:
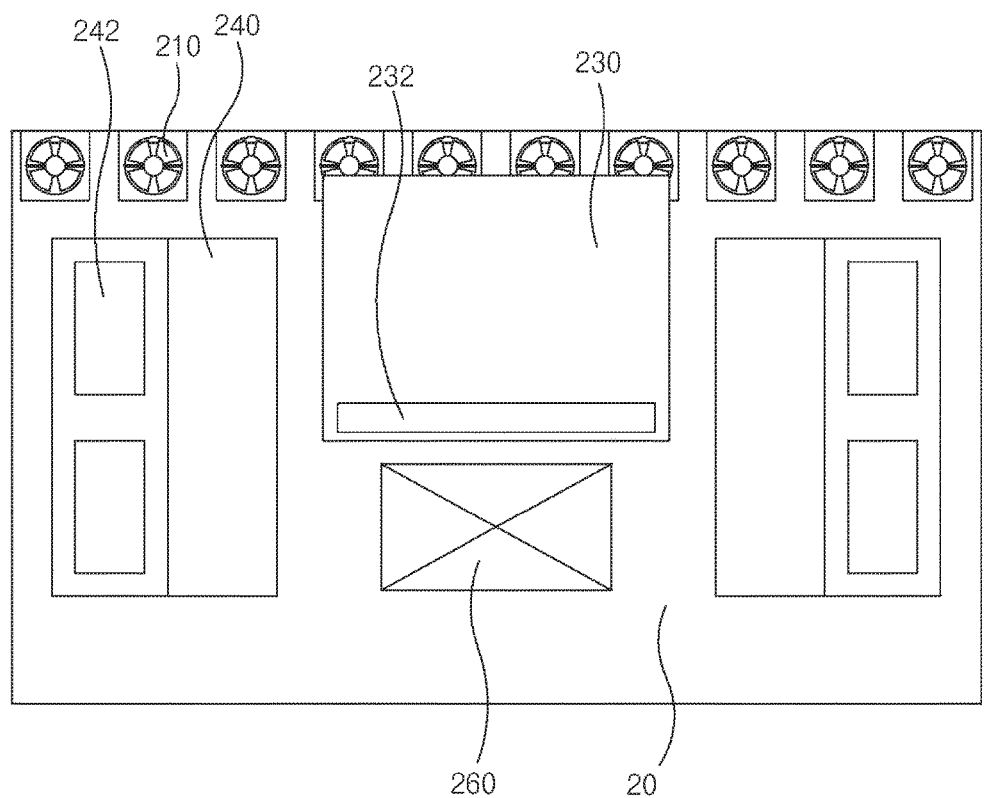
FIG. 11 is a view showing an exemplary configuration in which the discharge fan cover is coupled to FIG. 10.

FIG. 1 is an exploded perspective view of an outdoor display apparatus with enhanced temperature stability according to a first embodiment of the present invention, FIG. 2 is a cross-sectional view of an assembled outdoor display apparatus with enhanced temperature stability according to the first embodiment of the present invention, FIG. 5 is a view showing an exemplary shape of a front housing which is a front part of the overall housing, FIG. 6 is a view showing an exemplary rear view of the rear housing which is a rear part of the overall housing, FIG. 7 is a view showing an exemplary front view of the rear housing, FIG. 8 is a view showing an exemplary front view of a combination of a display panel and a rear bracket, FIG. 9 is a view showing an exemplary rear view of the combination of a display panel and a rear bracket, FIG. 10 is a front view of FIG. 9, and FIG. 11 is a view showing an exemplary configuration in which the discharge fan cover is coupled to the structure in FIG. 10.

Referring to FIGS. 1, 2, and 5 to 11, an outdoor display apparatus with enhanced temperature stability according to a first embodiment of the present invention includes a display panel 10, a rear bracket 20, a housing 30, and a transparent optical member 60.

Before describing the details of the components, the technical features of the first embodiment will be described.

The outdoor display apparatus with enhanced temperature stability according to the first embodiment of the present invention has lower rear inflows and upper rear outflows in the rear housing to induce airflows for stabilizing the internal temperature of the apparatus. Specifically, the air flows through a first clearance space existing between the rear bracket 20 and rear housing 50, a second clearance space existing between the rear brackets 20 and the rear surface of the display panel 10 and, and a third clearance space existing between the front surface of the display panel 10 and the transparent optical member 60. According to such a configuration, since the air circulates evenly through the main heating portion of the outdoor display apparatus the temperature inside the apparatus can be kept constant to greatly improve the temperature stability of the apparatus.

Hereinafter, detailed components for this configuration will be described.

The display panel 10 provides visual information to the user.

Since a considerable amount of heat is generated on the rear surface and the front surface of the display panel 10, cooling measures are required to cool down the generated heat.

Specifically, since various electronic devices 260 including a driver board for driving the display panel 10 and a set-top box, etc., are mounted on the rear surface of the display panel 10, which generates a considerable amount of heat during the operation, it is necessary to take measures against the generated heat.

In addition, the front surface of the display panel 10 is exposed to external light and emits heat by itself. That is, the front surface of the display panel 10 is exposed not only to the self-emitting heat but also to the external light reaching the front surface of the display panel 10 through the transparent optical member 60.

The rear bracket 20 is coupled to the display panel 10 on which the driver board is mounted.

The housing 30 accommodates a rear bracket 20 coupled to the display panel 10, and a transparent optical member 60 positioned on the front surface of the display panel 10 is coupled to the front surface of the housing 30.

For example, the housing 30 may include a front housing 40 coupled with a transparent optical member 60 and a rear housing 50 having an inlet 510 and an outlet 520 formed therein. Inlet filter and outlet filter may be provided in the inlet 510 and outlet, respectively.

A lower portion of the rear housing 50 is formed with an inlet 510 into which external air flows, and an upper portion of the rear housing 50 is formed with an outlet 520 through which the internal air is exhausted. Filters for preventing the entrance of external dust, moisture, etc., may be provided in the inlet 510 and outlet 520.

The transparent optical member 60 coupled to the front surface of the display panel 10 functions to protect the display panel 10. The material of the transparent optical member 60 may be glass or the like, however, any material having transparency can be applied as the transparent optical member 60.

For example, the display panel 10 and the transparent optical member 60 may be configured to be bonded by optical contact bonding. Optical bonding is a method of inducing intermolecular bonding in the bonding surfaces to maintain a very firm bonding performance. When such optical bonding is applied, no adhesive or mechanical method is used for bonding the display panel 10 and the transparent optical member 60, so that deformation, displacement, and stress due to bonding are not caused. In addition, the bonding force is very high, the optical interface is eliminated, the adhesive strength is maintained for a long time, and the environmental characteristic is excellent.

Hereinafter, the specific operation of the outdoor display apparatus with enhanced temperature stability according to the first embodiment of the present invention will be described as a discharge mode and a circulation mode.

Figure 3:
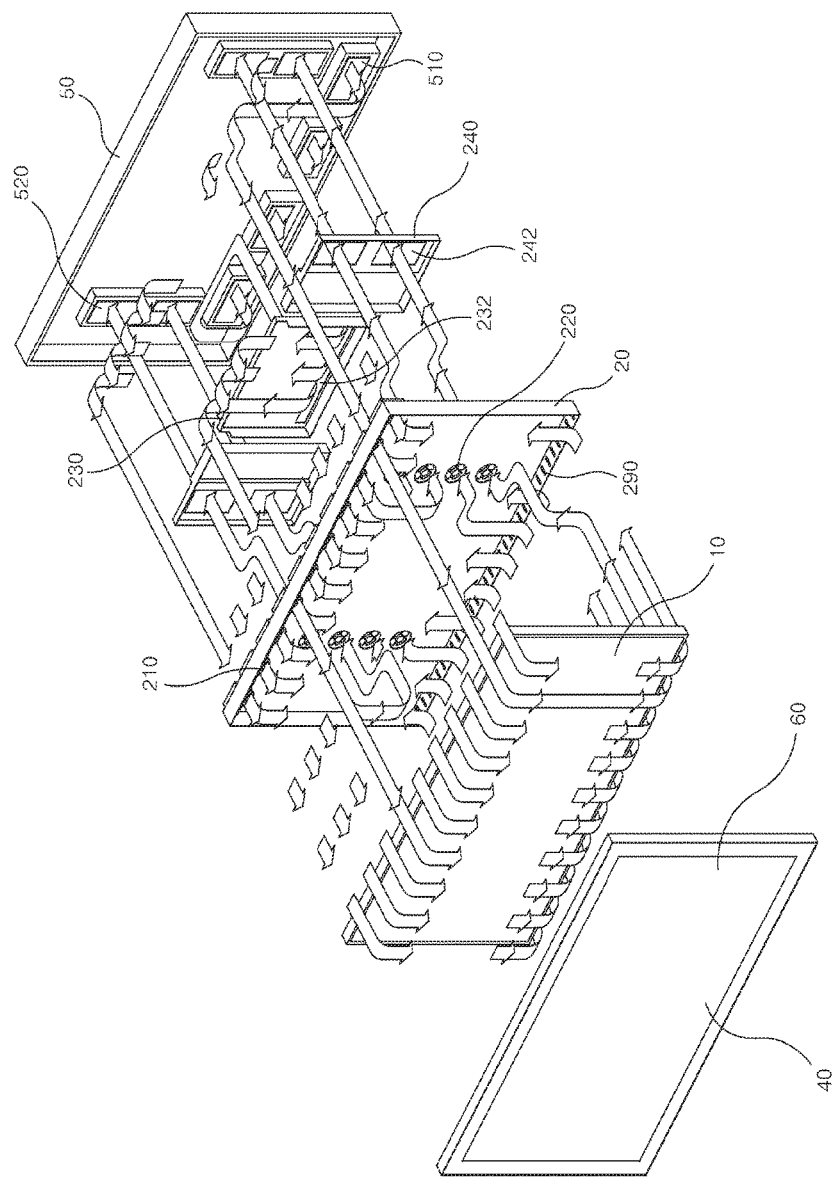
FIG. 3 is a view for explaining an air flow when an internal temperature rises in an outdoor display apparatus having enhanced temperature stability according to the first embodiment of the present invention.

FIG. 3 is a view for explaining airflows when an internal temperature rises in an outdoor display apparatus with enhanced temperature stability according to the first embodiment of the present invention.

In FIG. 3, airflows in a discharge mode or exhaust mode for discharging or exhausting the heat inside the apparatus to the outside is disclosed.

In the discharge mode, both the circulating fan 210 and the discharge fan 220 220 operate.

The circulation fans 210 are provided on the upper portion of the rear bracket 20 and the discharge fans 220 are provided on the rear bracket 20 in positions corresponding to the position of the outlet 520 formed in the rear housing 50.

First, the air introduced from the inlet 510 in the lower portion of the rear surface of the rear housing 50 by the circulation fan 210 absorbs heat while rising up in the first clearance space, and then flows into the second and third clearance spaces. The first clearance space is a space existing between the rear bracket 20 and the rear housing 50, the second clearance space is a space existing between the rear surface of the display panel 10 and the rear bracket 20, and the third clearance space is a space existing between the front surface of the display panel 10 and the transparent optical member 60.

The airflows into the second clearance space descend and absorb the heat existing in the second clearance space, i.e., the space between the rear surface of the display panel 10 and the rear bracket 20. The air that absorbed the heat of the second clearance space is guided by the operation of the discharge fan 220 to the outlet 520 to be discharged to the outside.

The airflows into the third clearance space descend and absorb the heat existing in the third clearance space, i.e., the space between the front surface of the display panel 10 and the transparent optical member 60. The air that absorbed the heat of the third clearance space moves into the second clearance space by the operation of the discharge fan 220, and then rises in the second clearance space while absorbing heat therein to be exhausted through the outlet 520 in the rear housing 50 to the outside.

The discharge mode is a configuration for keeping the internal temperature of the apparatus at an appropriate value by lowering the temperature when the temperature inside the apparatus rises above the appropriate range.

According to this configuration in the discharge mode, the air flowing into the main heating parts of the outdoor display apparatus, i.e., the first, the second and the third clearance spaces are uniformly circulated. Thus, the time required to calibrate the temperature inside the apparatus to the target value is shortened and the temperature inside the apparatus can be accurately reached to the target value while reducing the operation time of the circulating fan 210 and the discharge fan 220.

Figure 4:
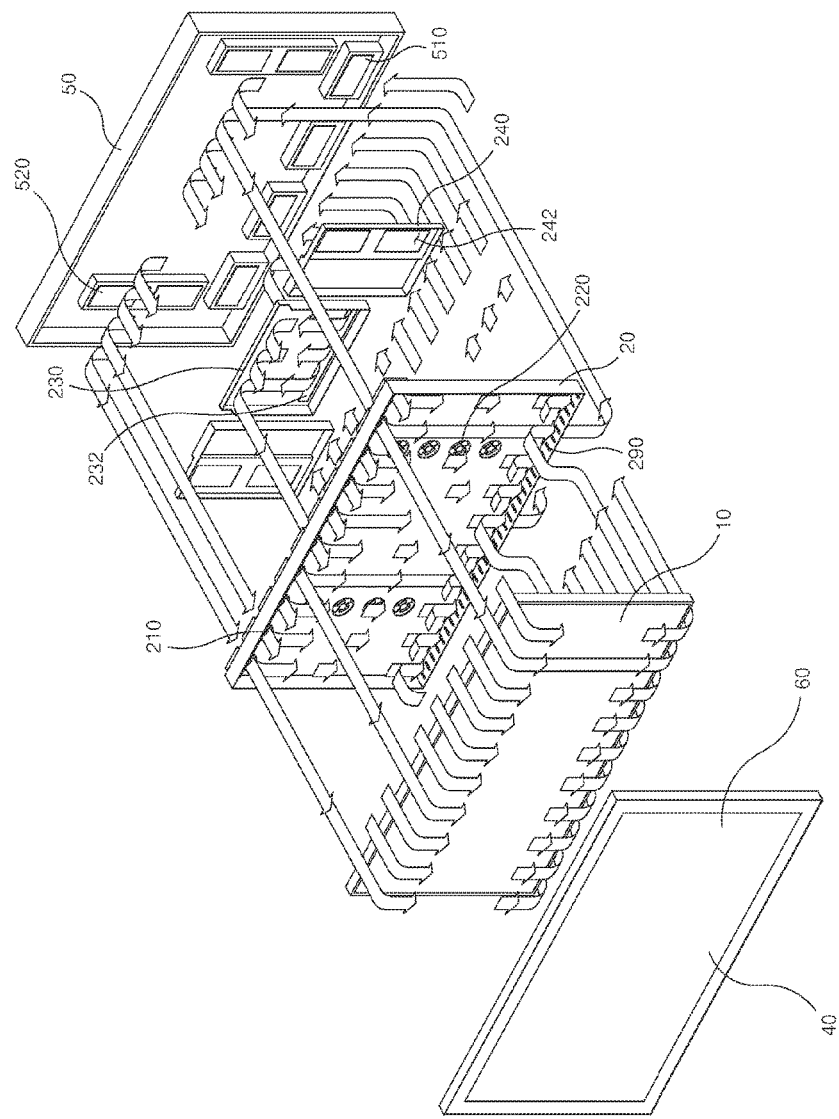
FIG. 4 is a view for explaining the air flow when the internal temperature is lowered in the outdoor display apparatus having enhanced temperature stability according to the first embodiment of the present invention.

FIG. 4 is a view for explaining the airflows when the internal temperature is lowered in the outdoor display having enhanced temperature stability according to the first embodiment of the present invention.

In FIG. 4, airflows in an internal circulation mode or a circulation mode for circulating heat inside the apparatus is disclosed.

In the circulation mode, the operation of the discharge fan 220 is stopped, and only the circulating fan 210 is operated.

First, by the operation of the circulating fan 210, the internal air rises in the first clearance space while absorbing the heat, and is branched into the second clearance space and the third clearance space, respectively.

The air that has branched to the second clearance space descends while absorbing the heat in the second clearance space and moves back to the first clearance space. The air that has moved to the first clearance space rises again in the first clearance space, and re-branches into the second clearance space and the third clearance space, respectively.

The air that has branched into the third clearance space descends while absorbing the heat in the third clearance space and moves back to the first clearance space. The air that has moved to the first clearance space also rises again in the first clearance space, and re-branches into the second clearance space and the third clearance space, respectively.

The circulation mode is a configuration for raising the temperature when the temperature inside the apparatus falls below an appropriate value so that the internal temperature of the apparatus is maintained within an appropriate range.

According to such a configuration in the circulation mode, in the process of raising the overall internal temperature using heat generated inside the apparatus, airflows are present in the all main heating parts of the outdoor display apparatus, that is, the first, the second and the third clearance spaces. Thus, the overall temperature distribution inside the apparatus becomes constant, the time required to calibrate the temperature inside the apparatus to the target value is shortened, and the temperature inside the apparatus is reduced while reducing the operation time of the circulating fan 210 while maintaining the temperature to the target value accurately.

For example, lower air holes 290 for inducing air flow from the second and the third clearance spaces to the first clearance space are formed in the lower region of the rear bracket 20 coupled with the display panel 10, and these lower air holes 290 can provide an airflow path in the circulation mode.

For example, a driver board cover 230 for covering a driver board for the display panel 10 is coupled to the rear bracket 20, and a driver board cover hole 232 is formed in the lower part of the driver board cover 230. According to such a configuration, the air rising in the first clearance space may be branched into a first and a second airflow. The first airflow in the first clearance enters into the driver board cover hole 232 to absorb the heat of the inner space of the driver board cover 230. The second airflow flows outside the driver board cover 230 to absorb the heat in the first clearance space outside the drive board cover 230. Thus, the heat of the rear surface of the display panel 10 can be more efficiently absorbed.

For example, the rear bracket 20 may further be coupled with at least one discharge fan cover 240 covering the discharge fan 220 provided in the rear bracket 20, and at least one discharge fan cover hole 242 is formed in each discharge fan cover 240. According to this configuration in the discharge mode, since the air from the second clearance space and the third clearance space moves into the first clearance space through the discharge fan cover hole 242 and then discharges through the outlet 520, the discharge process is performed stably and effectively.

Figure 12:
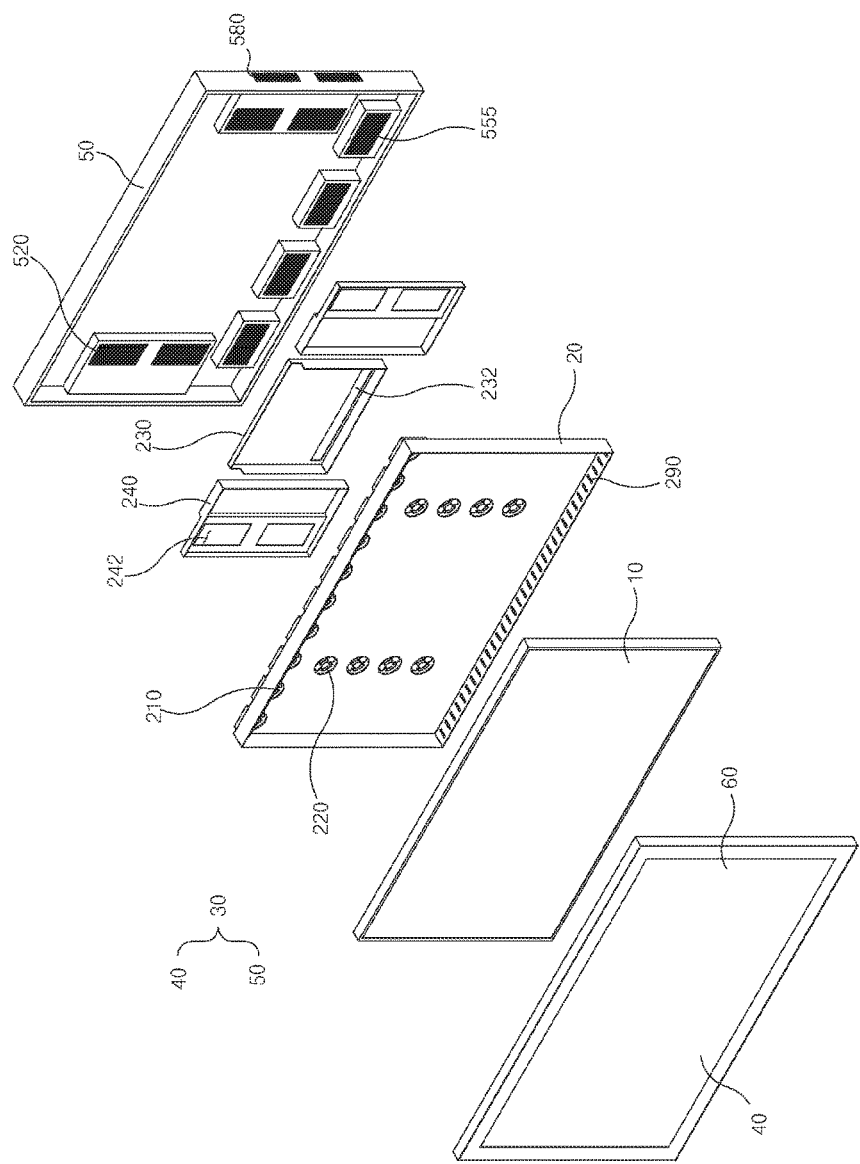
FIG. 12 is an exploded perspective view of an outdoor display apparatus having enhanced temperature stability according to a second embodiment of the present invention.
Figure 13:
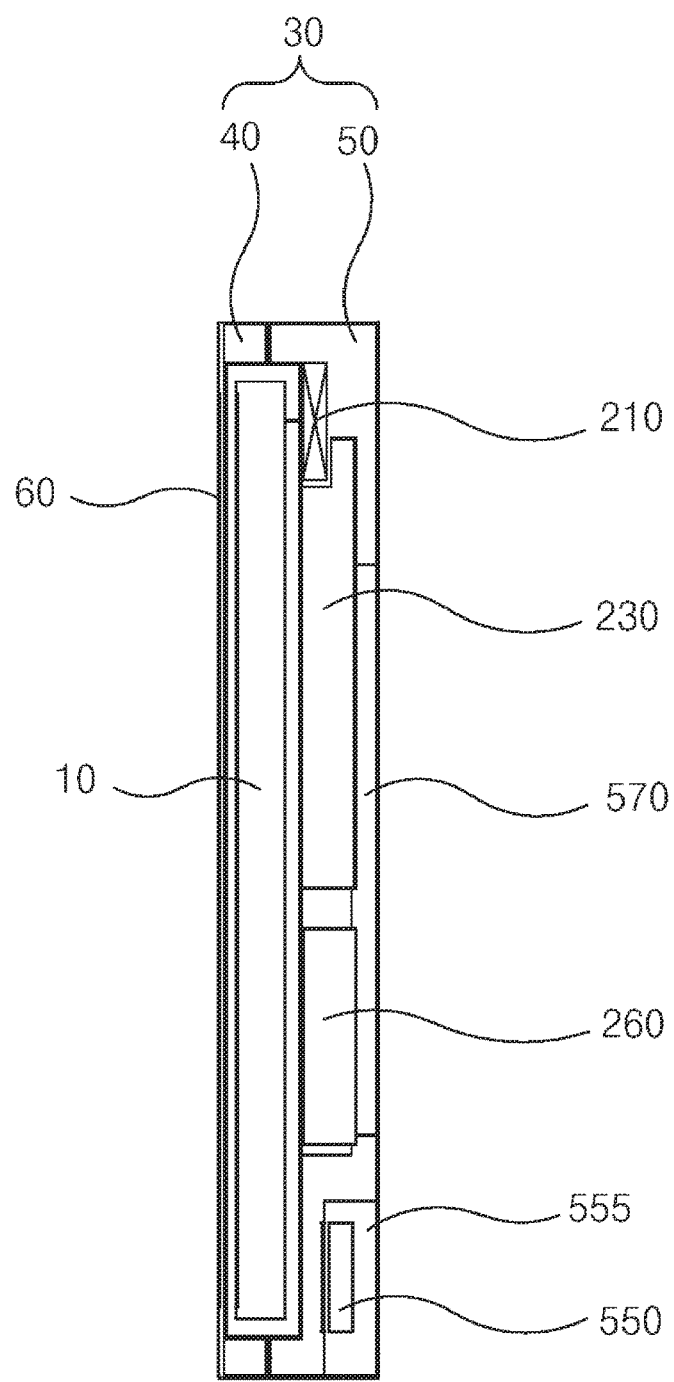
FIG. 13 is a cross-sectional side view of an assembled outdoor display apparatus having enhanced temperature stability according to a second embodiment of the present invention.
Figure 14:
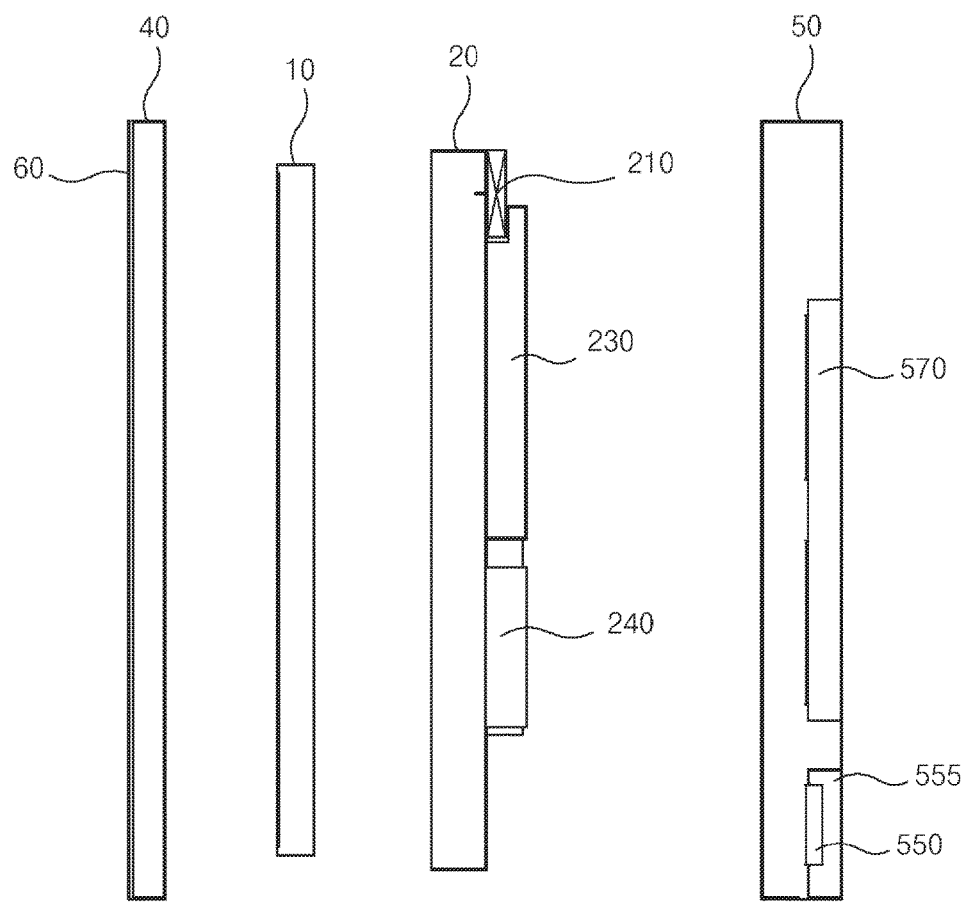
FIG. 14 is a cross-sectional side view of a disassembled outdoor display apparatus with enhanced temperature stability according to a second embodiment of the present invention.
Figure 15:
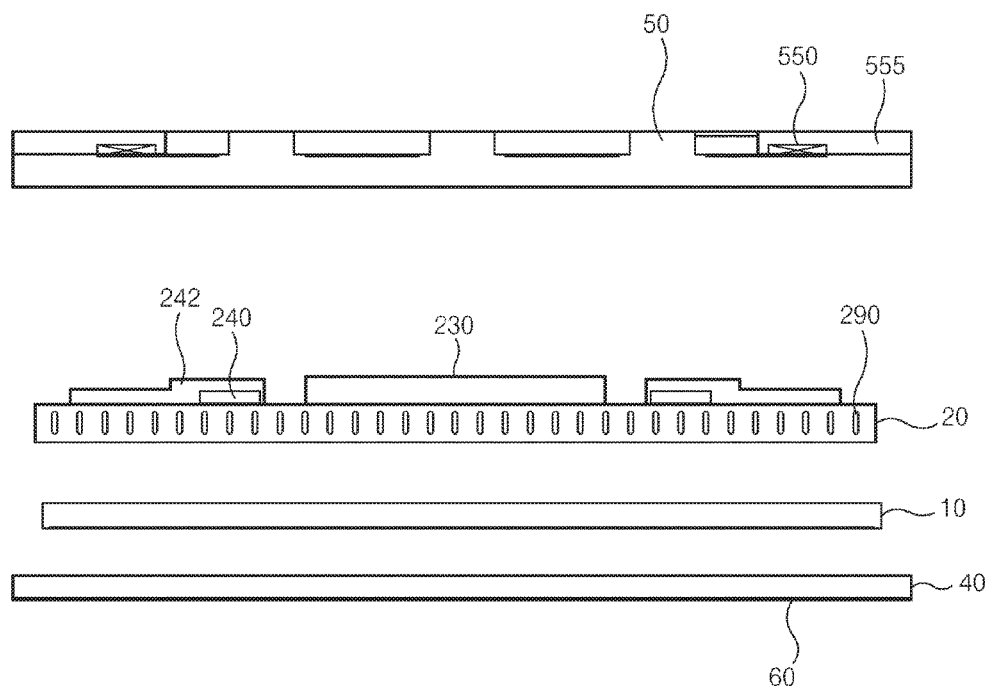
FIG. 15 is a cross-sectional bottom view of the disassembled outdoor display apparatus having enhanced temperature stability according to a second embodiment of the present invention.
Figure 19:
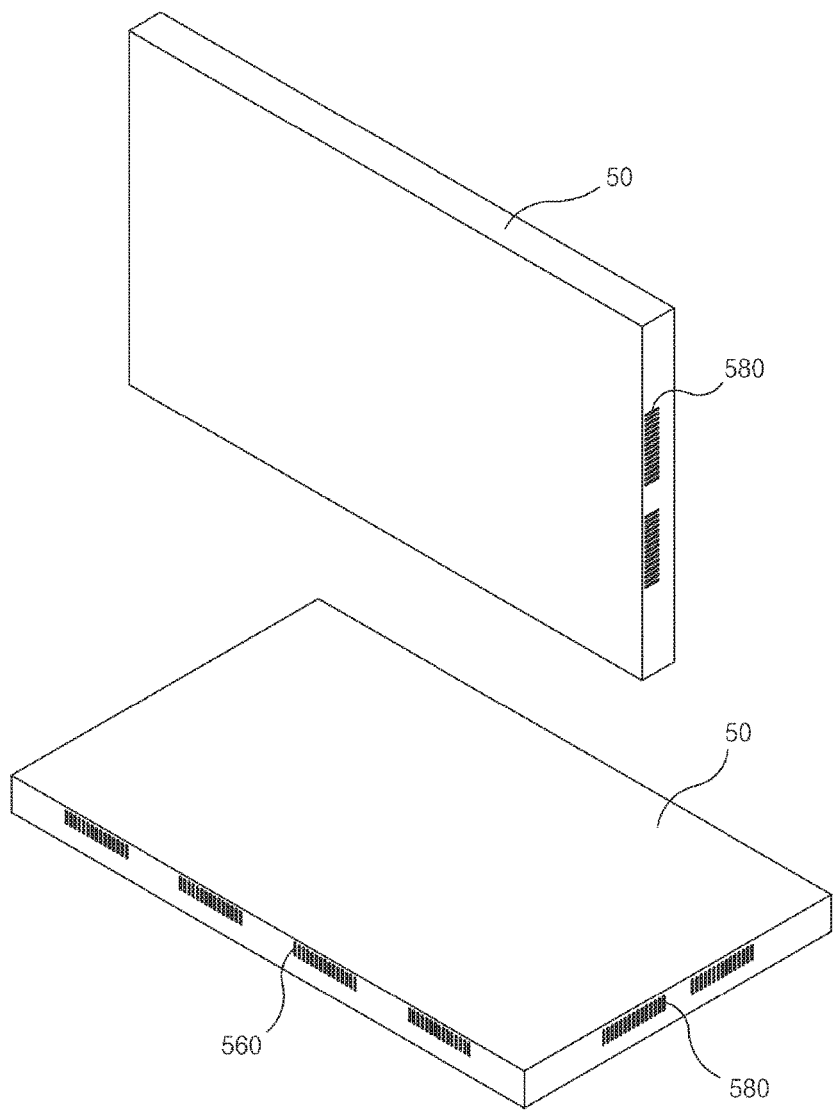
FIG. 19 is a view showing an exemplary rear view of a rear housing the overall housing included in the second embodiment of the present invention.
Figure 20:
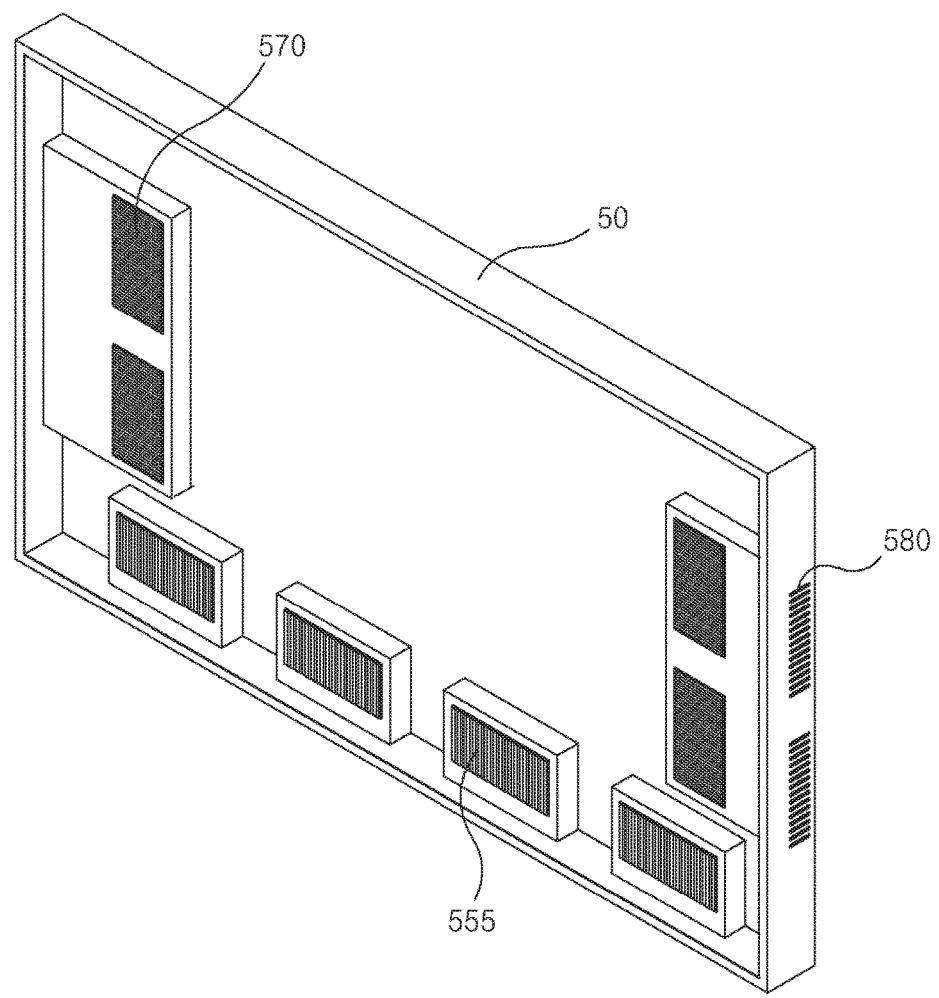
FIG. 20 is a view showing an exemplary front view of the rear housing included in the second embodiment of the present invention.

FIG. 12 is an exploded perspective view of an outdoor display apparatus with enhanced temperature stability according to a second embodiment of the present invention, FIG. 13 is a cross-sectional side view of an assembled outdoor display apparatus with enhanced temperature stability according to the second embodiment of the present invention, FIG. 14 is a cross-sectional side view of an dissembled outdoor display apparatus with enhanced temperature stability according to the second embodiment of the present invention, FIG. 15 is a cross-sectional bottom of a dissembled outdoor display apparatus with enhanced temperature stability according to the second embodiment of the present invention, FIG. 19 is a view showing an exemplary rear view of a rear housing, and FIG. 20 is a view showing an exemplary front view of a rear housing.

Referring to FIGS. 12 to 15, FIGS. 19 and 20 together with FIG. 5 showing an exemplary shape of the front housing, FIG. 8 showing an exemplary front shape of a combination of a display panel and a rear bracket, FIG. 9 showing an exemplary backside configuration of the combination of FIG. 8, FIG. 10 showing front view of the combination of FIG. 9, and FIG. 11 showing an exemplary configuration in which the discharge fan cover is coupled to the front view of FIG. 10, the outdoor display apparatus with an enhanced temperature stability includes a display panel 10, a rear bracket 20, a housing 30, and a transparent optical member 60.

Prior to describing the detailed components, the technical features of the second embodiment will be described.

The outdoor display apparatus with enhanced temperature stability according to the second embodiment of the present invention has lower bottom inflows and upper side outflows in the rear housing to induce airflows for stabilizing the internal temperature of the apparatus. Specifically, the air flows through a first clearance space existing between the rear bracket 20 and rear housing 50, a second clearance space existing between the rear brackets 20 and the rear surface of the display panel 10 and, and a third clearance space existing between the front surface of the display panel 10 and the transparent optical member 60. According to such a configuration, since the air circulates evenly through the main heating portion of the outdoor display apparatus the temperature inside the apparatus can be kept constant to greatly improve the temperature stability of the apparatus.

The difference between the first embodiment and the second embodiment described above is as follows.

In the first embodiment, at least one inlet 510 is formed in the lower portion of the rear housing 50, and at least one outlet 520 is formed in the upper portion of the rear housing 50 to operate in a rear inflow and rear outflow manner.

On the other hand, in the second embodiment, at least one inlet 560 is formed on the lower bottom portion of the rear housing 50, and at least one outlet 580 is formed on the upper side portion of the rear housing 50 to operate in a bottom inflow and side outflow manner.

Hereinafter, the second embodiment will be described focusing on the difference from the first embodiment in order to avoid duplication of description. Of course, the description of the same configuration disclosed in the first embodiment can also be applied to the second embodiment.

A specific operation of the outdoor display apparatus having enhanced temperature stability according to the second embodiment of the present invention will be described by dividing it into a discharge mode and a circulation mode.

Figure 16:
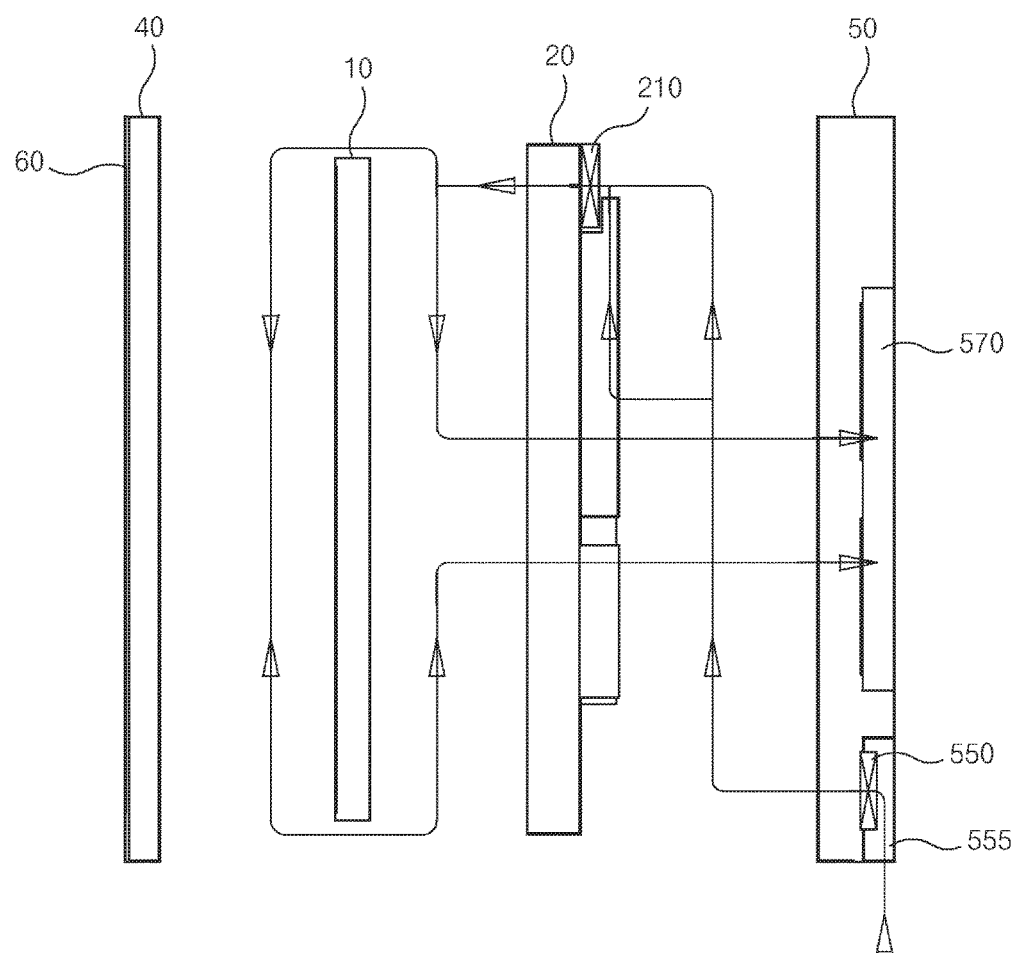
FIG. 16 is a view for explaining an air flow when the internal temperature rises by using the cross-sectional side view of FIG. 14 of the outdoor display apparatus with enhanced temperature stability according to the second embodiment of the present invention.
Figure 17:
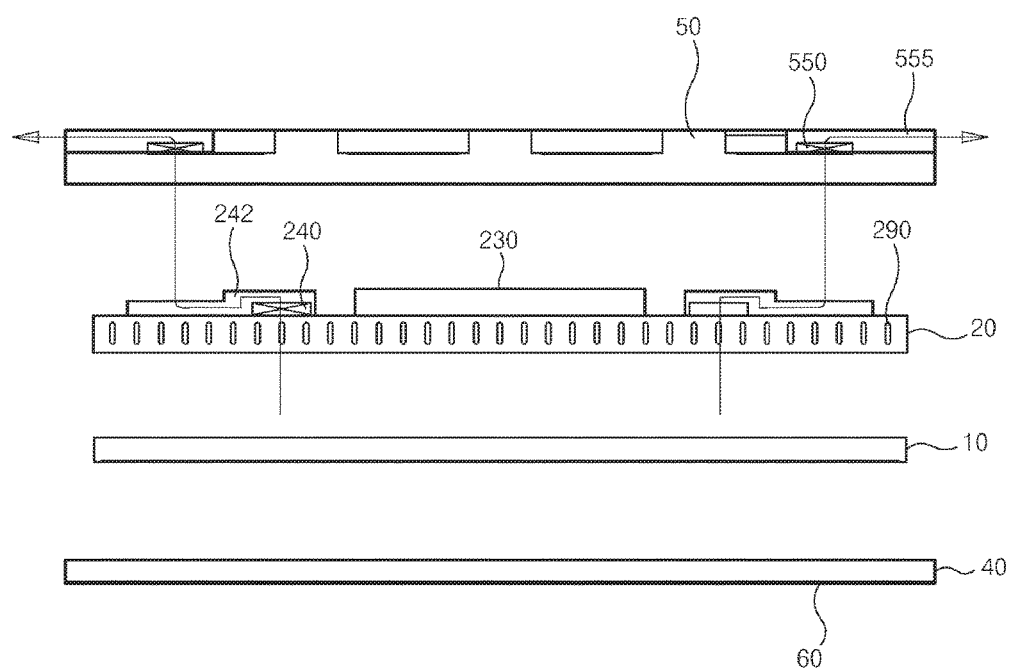
FIG. 17 is a view for explaining the air flow when the internal temperature rises by using the cross-sectional bottom view of FIG. 15 of the outdoor display apparatus with enhanced temperature stability according to the second embodiment of the present invention.

FIG. 16 is a view for explaining airflows when an internal temperature rises in an outdoor display apparatus with enhanced temperature stability according to the first embodiment of the present invention using a cross-sectional side view of FIG. 14, and FIG. 17 is a view for explaining airflows when an internal temperature rises in the outdoor display apparatus with enhanced temperature stability according to the second embodiment of the present invention using bottom lower view of FIG. 15.

In FIGS. 16 and 17, airflows in a discharge mode or exhaust mode for discharging or exhausting the heat inside the apparatus to the outside is disclosed.

The circulation fans 210 are provided on the upper portion of the rear bracket 20 and the discharge fans 220 are provided on the rear bracket 20 in positions corresponding to the positions of the outlet 580 and outlet filter 570 formed in the rear housing 50.

First, the air introduced from the inlet 560 in the lower bottom portion of the rear surface of the rear housing 50 by the circulation fan 210 absorbs heat while rising up in the first clearance space, and then flows into the second and third clearance spaces. The first clearance space is a space existing between the rear bracket 20 and the rear housing 50, the second clearance space is a space existing between the rear surface of the display panel 10 and the rear bracket 20, and the third clearance space is a space existing between the front surface of the display panel 10 and the transparent optical member 60.

The airflows branched into the second clearance space descend and absorb the heat existing in the second clearance space, i.e., the space between the rear surface of the display panel 10 and the rear bracket 20. The air that absorbed the heat of the second clearance space is guided by the operation of the discharge fan 220 to the outlet filter 570 and outlet 580 to be discharged to the outside.

The airflows branched into the third clearance space descend and absorb the heat existing in the third clearance space, i.e., the space between the front surface of the display panel 10 and the transparent optical member 60. The air that absorbed the heat of the third clearance space moves into the second clearance space by the operation of the discharge fan 220, and then rises in the second clearance space while absorbing heat therein to be exhausted through the outlet filter 570 and outlet 580 in the rear housing 50 to the outside.

The discharge mode is a configuration for keeping the internal temperature of the apparatus at an appropriate value by lowering the temperature when the temperature inside the apparatus rises above the appropriate range.

According to this configuration in the discharge mode, the air flowing into the main heating parts of the outdoor display apparatus, i.e., the first, the second and the third clearance spaces are uniformly circulated. Thus, the time required to calibrate the temperature inside the apparatus to the target value is shortened and the temperature inside the apparatus can be accurately reached to the target value while reducing the operation time of the circulating fan 210 and the discharge fan 220.

Figure 18:
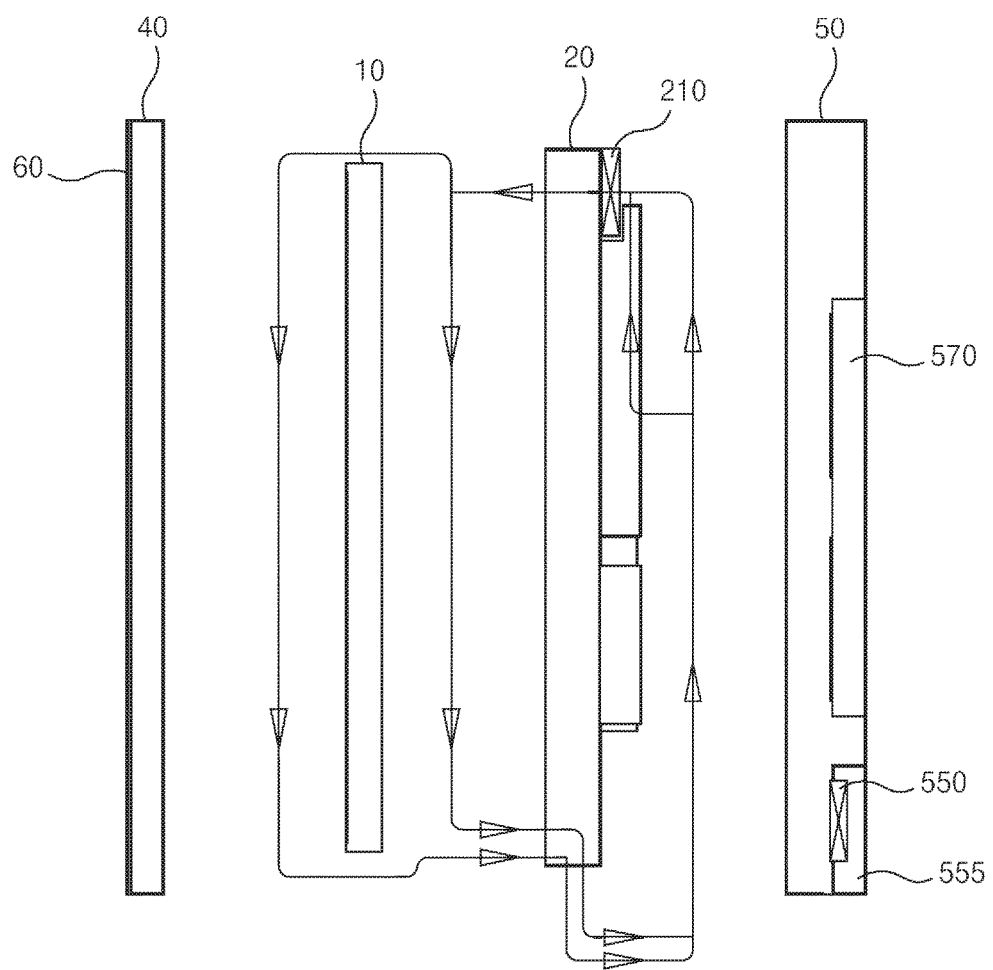
FIG. 18 is a view for explaining the air flow when the internal temperature is lowered by using the cross-sectional bottom view of FIG. 15 of the outdoor display apparatus with enhanced temperature stability according to the second embodiment of the present invention.

FIG. 18 is a view for explaining the airflows when the internal temperature is lowered using the cross-sectional bottom view of FIG. 15 for the outdoor display having enhanced temperature stability according to the second embodiment of the present invention.

In FIG. 18, airflows in an internal circulation mode or a circulation mode for circulating heat inside the apparatus is disclosed.

In the circulation mode, the operation of the discharge fan 220 is stopped, and and only the circulating fan 210 is operated.

First, by the operation of the circulating fan 210, the internal air rises in the first clearance space while absorbing the heat, and is branched into the second clearance space and the third clearance space, respectively.

The air that has branched into the second clearance space descends while absorbing the heat in the second clearance space and moves back to the first clearance space. The air that has moved to the first clearance space rises again in the first clearance space, and re-branches into the second clearance space and the third clearance space, respectively.

The air that has branched into the third clearance space descends while absorbing the heat in the third clearance space and moves back to the first clearance space. The air that has moved to the first clearance space also rises again in the first clearance space, and re-branches into the second clearance space and the third clearance space, respectively.

The circulation mode is a configuration for raising the temperature when the temperature inside the apparatus falls below an appropriate value so that the internal temperature of the apparatus is maintained within an appropriate range.

According to such a configuration in the circulation mode, in the process of raising the overall internal temperature using heat generated inside the apparatus, airflows are present in the all main heating parts of the outdoor display apparatus, that is, the first, the second and the third clearance spaces. Thus, the overall temperature distribution inside the apparatus becomes constant, the time required to calibrate the temperature inside the apparatus to the target value is shortened, and the temperature inside the apparatus is reduced while reducing the operation time of the circulating fan 210 while maintaining the temperature to the target value accurately.

For example, lower air holes 290 for inducing air flow from the second and the third clearance spaces to the first clearance space are formed in the lower region of the rear bracket 20 coupled with the display panel 10, and these lower air holes 290 can provide an airflow path in the circulation mode.

For example, a driver board cover 230 for covering a driver board for the display panel 10 is coupled to the rear bracket 20, and a driver board cover hole is formed in the lower part of the driver board cover 230. According to such a configuration, the air rising in the first clearance space may be branched into a first and a second airflow. The first airflow in the first clearance space enters into the driver board cover hole 232 to absorb the heat of the inner space of the driver board cover 230. The second airflow in the first clearance space flows outside the driver board cover 230 to absorb the heat in the first clearance space outside the drive board cover 230. Thus, the heat of the rear surface of the display panel 10 can be more efficiently absorbed.

For example, the rear bracket 20 may further be coupled with at least one discharge fan cover 240 covering the discharge fan 220 provided in the rear bracket 20, and at least one discharge fan cover hole 242 is formed in each discharge fan cover 240. According to this configuration in the discharge mode, the airflow from the second clearance space and the third clearance space moves into the first clearance space through the discharge fan cover hole 242 to be discharged through the outlet 580 to the outside. Thus, the discharge process is performed stably and effectively.

For example, the inlet fan 550 may be additionally provided at the inlet 560 as a means for increasing the air flow input, but this is optional and not an essential configuration.

As described above in detail, according to the present invention, since the air circulates the main heat-generating parts inside the apparatus uniformly during the process of controlling the temperature inside the apparatus, the overall temperature distribution inside the apparatus can be kept constant, the time required to calibrate the temperature to the target value can be shortened and the operating time of the fan for inducing the air flow can be reduced while allowing the temperature inside the apparatus to reach the target value more accurately.

In addition, the outdoor display apparatus with enhanced temperature stability of the present invention can prevent a malfunction and a shortening of life of the display apparatus by suppressing a rise in the temperature at both the front panel and the inside of the display panel due to self-generated interior heat and exterior heat caused by direct sunlight, reduce the difference between the external temperature and the inside temperature of the display apparatus to uniformly maintain maintain the temperature inside the display apparatus.

In addition, the outdoor display apparatus of the present invention can enhance the temperature stability by discharging heat inside the apparatus through an improved air flow path without providing an expensive and large-sized air conditioner inside the outdoor display apparatus, lower the unit price of the display apparatus and provide a relatively compact product.

The invention claimed is:

1. An outdoor display apparatus having enhanced temperature stability comprising: a display panel having a driver board; a rear bracket coupled to the display panel having the driver board; and a housing for accommodating a rear bracket coupled to the display panel, being coupled to a transparent optical member disposed on a front surface of the display panel and having at least one inlet through which external air is introduced and at least one outlet through which internal air is discharged, wherein: the inlet is formed at a lower portion of a rear surface of the housing, the outlet is formed at an upper portion of a rear surface of the housing, and air flows through a first clearance space existing between the rear bracket and the housing, a second clearance space existing between the rear bracket and the rear surface of the display panel and a third clearance space existing between the front surface of the display panel and the transparent optical member; wherein: in a discharge mode for discharging internal heat to the outside, at least one circulation fan and at least one discharge fan provided in the rear bracket operate, the air introduced from the inlet in the lower portion of the rear surface of the housing by the circulation fan absorbs heat while rising up in the first clearance space and then flows into the second and third clearance spaces, the airflow into the second clearance space descend and absorb the heat existing in the second clearance space flows to the outlet in the housing by the operation of the discharge to be discharged to the outside, and the airflow into the third clearance space descend and absorb the heat existing in the third clearance space moves into the second clearance space by the operation of the discharge fan and then rises in the second clearance space while absorbing heat therein to be discharged through the outlet in the housing to the outside.

2. The outdoor display apparatus according to claim 1, wherein:
in a circulation mode for circulating internal heat, the circulation fan operates operates and while the discharge fan stops its operation,
the air in the first clearance space rises while absorbing the heat and is branched into the second clearance space and the third clearance space, respectively,
the air branched into the second clearance space descends while absorbing the heat in the second clearance space and moves back to the first clearance space and the air moved from the second clearance space to the first clearance space rises again in the first clearance space and is re-branched into the second clearance space and the third clearance space, respectively,
the air branched into the third clearance space descends while absorbing the heat in the third clearance space and moves back to the first clearance space and the air moved from the third clearance space to the first clearance space rises again in the first clearance space and is re-branched into the second clearance space and the third clearance space, respectively.

3. The outdoor display apparatus according to claim 2, wherein:
at least one lower air hole is formed in the lower portion of the rear bracket to guide the airflow from the second clearance space and the third clearance space to the first clearance space and to provide an air flow path in the circulation mode.

4. The outdoor display apparatus according to claim 1, wherein:
a driver board cover for covering the driver board of the display panel is coupled to the rear bracket.

5. The outdoor display apparatus according to claim 4, wherein:
at least one drive board cover hole is formed in the lower portion of the drive board cover to branch the air rising in the first clearance space into a first airflow and a second airflow, and
the first airflow in the first clearance space enters into the driver board cover hole to absorb the heat of the inner space of the driver board cover and the second airflow flows outside the driver board cover to absorb the heat in the first clearance space outside the drive board cover.

6. The outdoor display apparatus according to claim 1, wherein: at least one discharge fan cover for covering the discharge fan is provided in the rear bracket.

7. The outdoor display apparatus according to claim 6, wherein:
at least one discharge fan cover hole is formed in the discharge fan cover, and
in the discharge mode, the airflow from the second clearance space and the third clearance space moves through the discharge fan cover hole to the first clearance space to be discharged through the outlet to the outside.

8. The outdoor display apparatus according to claim 1, wherein:
the display panel and the transparent optical member are bonded by optical contact bonding to each other.

9. The outdoor display apparatus according to claim 1, wherein:
the housing comprises a front housing to which the transparent optical member is coupled and a rear housing in which the inlet and outlet are formed.

10. An outdoor display apparatus having enhanced temperature stability comprising: a display panel having a driver board; a rear bracket coupled to the display panel having the driver board; and a housing for accommodating a rear bracket coupled to the display panel, being coupled to a transparent optical member disposed on a front surface of the display panel and having at least one inlet through which external air is introduced and at least one outlet through which internal air is discharged, wherein: the inlet is formed at a lower bottom portion of the housing, the outlet is formed at an upper side portion of the housing, and air flows through a first clearance space existing between the rear bracket and the housing, a second clearance space existing between the rear bracket and the rear surface of the display panel and a third clearance space existing between the front surface of the display panel and the transparent optical member: wherein: in a discharge mode for discharging internal heat to the outside, at least one circulation fan and at least one discharge fan provided in the rear bracket operate, the air introduced from the inlet in the lower bottom portion of the rear surface of the housing by the circulation fan absorbs heat while rising up in the first clearance space and then flows into the second and third clearance spaces, the airflow into the second clearance space descend and absorb the heat existing in the second clearance space flows to the outlet in the housing by the operation of the discharge fan to be discharged to the outside, and the airflow into the third clearance space descend and absorb the heat existing in the third clearance space moves into the second clearance space by the operation of the discharge fan and then rises in the second clearance space while absorbing heat therein to be discharged through the outlet in the housing to the outside.

11. The outdoor display apparatus according to claim 10, wherein:
in a circulation mode for circulating internal heat, the circulation fan operates and while the discharge fan stops its operation,
the air in the first clearance space rises while absorbing the heat and is branched into the second clearance space and the third clearance space, respectively,
the air branched into the second clearance space descends while absorbing the heat in the second clearance space and moves back to the first clearance space and the air moved from the second clearance space to the first clearance space rises again in the first clearance space and is re-branched into the second clearance space and the third clearance space, respectively,
the air branched into the third clearance space descends while absorbing the heat in the third clearance space and moves back to the first clearance space and the air moved from the third clearance space to the first clearance space rises again in the first clearance space and is re-branched into the second clearance space and the third clearance space, respectively.

12. The outdoor display apparatus according to claim 11, wherein:
at least one lower air hole is formed in the lower portion of the rear bracket to guide the airflow from the second clearance space and the third clearance space to the first clearance space and to provide an air flow path in the circulation mode.

13. The outdoor display apparatus according to claim 10, wherein:
a driver board cover for covering the driver board of the display panel is coupled to the rear bracket.

14. The outdoor display apparatus according to claim 13, wherein:
at least one drive board cover hole is formed in the lower portion of the drive board cover to branch the air rising in the first clearance space into a first airflow and a second airflow, and
the first airflow in the first clearance space enters into the driver board cover hole to absorb the heat of the inner space of the driver board cover and the second airflow flows outside the driver board cover to absorb the heat in the first clearance space outside the drive board cover.

15. The outdoor display apparatus according to claim 10, wherein: at least one discharge fan cover for covering the discharge fan is provided in the rear bracket.

16. The outdoor display apparatus according to claim 15, wherein:
at least one discharge fan cover hole is formed in the discharge fan cover, and
in the discharge mode, the airflow from the second clearance space and the third clearance space moves through the discharge fan cover hole to the first clearance space to be discharged through the outlet to the outside.

17. The outdoor display apparatus according to claim 10, wherein:
the display panel and the transparent optical member are bonded by optical contact bonding to each other.

18. The outdoor display apparatus according to claim 10, wherein:
the housing comprises a front housing to which the transparent optical member is coupled and a rear housing in which the inlet and outlet are formed.

* * * * *